United States Patent
Wu

[19]

[11] Patent Number: 6,064,085
[45] Date of Patent: May 16, 2000

[54] DRAM CELL WITH A MULTIPLE FIN-SHAPED STRUCTURE CAPACITOR

[75] Inventor: Shye-Lin Wu, Hsinchu, Taiwan

[73] Assignee: Texas Instruments-Acer Incorporated, Hsinchu, Taiwan

[21] Appl. No.: 09/089,873

[22] Filed: Jun. 3, 1998

[51] Int. Cl.[7] .................................. H01L 27/108
[52] U.S. Cl. .................. 257/296; 257/296; 257/308; 257/309; 257/307; 257/306; 257/311; 438/243; 438/244; 438/253; 438/386; 438/387; 438/388; 438/389; 438/398
[58] Field of Search .................. 257/296, 308, 257/309, 307, 306, 311; 438/243, 244, 253, 386, 387, 388, 389, 398

[56] References Cited

U.S. PATENT DOCUMENTS

| | | | |
|---|---|---|---|
| 5,766,994 | 6/1998 | Tseng | 438/254 |
| 5,801,413 | 9/1998 | Pan | 257/301 |
| 5,804,852 | 9/1998 | Yang et al. | 257/308 |
| 5,835,337 | 11/1998 | Watanabe et al. | 361/301.4 |
| 5,889,301 | 3/1999 | Tseng | 257/308 |
| 5,903,024 | 5/1999 | Hsu | 257/303 |
| 5,903,430 | 5/1999 | Takaishi | 361/301.4 |
| 5,909,045 | 6/1999 | Chao | 257/308 |
| 5,912,485 | 6/1999 | Chao | 257/308 |

FOREIGN PATENT DOCUMENTS

| | | | |
|---|---|---|---|
| 405075050 | 3/1993 | Japan | 257/308 |
| 405082750 | 4/1993 | Japan | 257/308 |

*Primary Examiner*—Mahshid Saadat
*Assistant Examiner*—Edgardo Ortiz
*Attorney, Agent, or Firm*—Harness, Dickey & Pierce, P.L.C.

[57] ABSTRACT

The present invention discloses a novel multiple fin-shaped capacitor for use in semiconductor memories. The capacitor has a plurality of horizontal fins and a crown shape. The capacitor structure comprises a bottom storage electrode. The bottom storage electrode comprises of a plurality of horizontal fins and a crown shape, wherein said crown shape includes two vertical pillars, and said plurality of horizontal fins extend outside from an external surface of said crown shape. A second dielectric layer is formed on the surface of the bottom storage electrode layer. A top storage electrode layer is formed along the surface of second dielectric layer. By including horizontal fins and vertical pillars, the surface area of the capacitor is significantly increased, resulting in increased capacitance.

14 Claims, 7 Drawing Sheets

DRAM CELL WITH A MULTIPLE FIN-SHAPED STRUCTURE CAPACITOR

FIELD OF THE INVENTION

The present invention relates to semiconductor capacitors, and more specifically, to a multiple fin-shaped structure capacitor.

BACKGROUND OF THE INVENTION

Semiconductor Dynamic Random Access Memory (DRAM) devices have been applied in the integrated circuits for many years. A memory cell typically consists of a storage capacitor and an access transistor for each bit to be stored by the semiconductor DRAM. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits.

With the coming of Ultra Large Scale Integrated (ULSI) DRAM devices, the sizes of memory cells have gotten smaller and smaller such that the area available for a single memory cell has become very small. This has caused a reduction in capacitor area, which in turn results in a reduction in cell capacitance. The reduction in memory cell area is required for high density DRAMs. This causes reduction in capacitor area, resulting in the reduction of cell capacitance. For very small memory cells, planar capacitors become very difficult to use reliably. Specifically, as the size of the capacitor decreases, the capacitance of the capacitor also decreases. Similarly, the amount of the charge capable of being stored by the capacitor decreases. This results in the capacitor being very susceptible to α particle radiation. Additionally, as the capacitance decreases, the charge held by storage capacitor must be refreshed often. A simple stacked capacitor can not provide sufficient capacitance, even with high dielectric films, such as $Ta_2O_5$, for the DRAM capacitor.

Prior art approaches to overcome these problems have resulted in the development of the various types of capacitors. Such as the trench capacitor (see for example U.S. Pat. No. 5,374,580) and the stacked capacitor (see for example U.S. Pat. No. 5,021,357). However, the trench capacitor has the well-known problem of "gated diode leakage," which is the leakage of current resulting in the trench capacitor failing to hold a charge. The manufacture of the stacked capacitor causes difficulties due to the limitation of the lithography technique. In addition, reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (please see "A CAPACITOR-OVER-BIT-LINE CELL WITH HEMISPHERICAL-GRAIN STORAGE NODE FOR 64 Mb DRAMs", M. Sakao etc. microelectronics research laboratories, NEC Corporation). The HSG-Si is deposited by low pressure chemical vapor deposition method at the transition temperature from amorphous-Si to polycrystalline-Si. Further, a cylindrical capacitor using Hemispherical-Grained Si has been proposed (see "A NEW CYLIDRICAL CAPACITOR USING HEMI-SPHERICAL GRAINED Si FOR 256 Mb DRAMs", H. Watanabe et al., Tech Dig,Dec. 1992, pp.259–262).

SUMMARY OF THE INVENTION

The present invention is a multiple fin-shaped capacitor of a dynamic random access memory cell, and the capacitor has a plurality of horizontal fins and a crown shape comprising two vertical pillars for use in semiconductor memories. The capacitor structure comprises a bottom storage electrode. Besides, the capacitor further comprises a stack of a first dielectric layer and a silicon nitride layer located between the bottom storage electrode and the semiconductor substrate.

The bottom storage electrode formed on silicon nitride layer, and communicates to the semiconductor substrate via a hole in first dielectric layer and silicon nitride layer. The bottom storage electrode comprises a plurality of horizontal fins and a crown shape, wherein said crown shape includes two vertical pillars, said plurality of horizontal fins extend outside from an external surface of said crown shape. The bottom storage electrode is chosen from doped polysilicon or in-situ doped polysilicon, aluminum, copper, tungsten, or titanium. A second dielectric layer is formed on the surface of the bottom storage electrode layer.

A top storage electrode layer is formed along the surface of second dielectric layer and is chosen from doped polysilicon or in-situ doped polysilicon, aluminum, cooper, tungsten, or titanium. By including horizontal fins and vertical pillars, the surface area of the capacitor is significantly increased, resulting in increased capacitance.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 13:
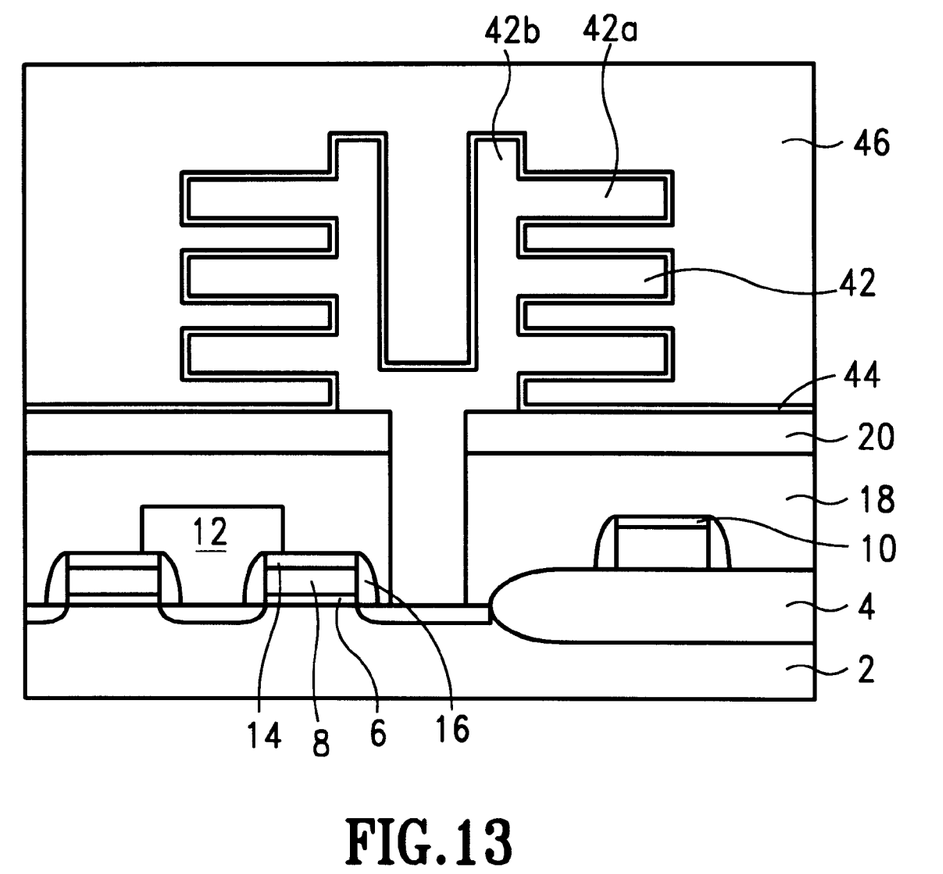
FIG. 13 is a cross sectional view of a semiconductor wafer illustrating the step of forming a third conductive layer along the surface of the dielectric layer.

The present invention relates to a high density memory cell for DRAM, which has an enlarge surface area of the capacitor to increase the performance of the memory cell. Further, the present invention uses high etching selectivity (higher than 2000:1) between BPSG (borophosphosilicate glass) and CVD silicon dioxide to form multi-fin capacitor structure. As will be seen below, this technique can be used to create a multiple fin-shape capacitor with a plurality of horizontal fins and a crown shape, the crown shape includes two vertical pillars for use in semiconductor memories. The detailed description will be described as follows. Referring to FIG. 13, the bottom storage electrode 42 formed on silicon nitride layer 20, and communicates to the semiconductor substrate 2 via a hole in first dielectric layer 18 and silicon nitride layer 20. The bottom storage electrode 42 comprises a plurality of horizontal fins 42a and a crown shape, wherein said crown shape includes two vertical pillars 42b, said plurality of horizontal fins 42a extend outside from an external surface of said crown shape. A second dielectric layer 44 is formed on the surface of the bottom storage electrode layer 42. A top storage electrode layer 46 is formed along the surface of second dielectric layer 44.

Figure 1:
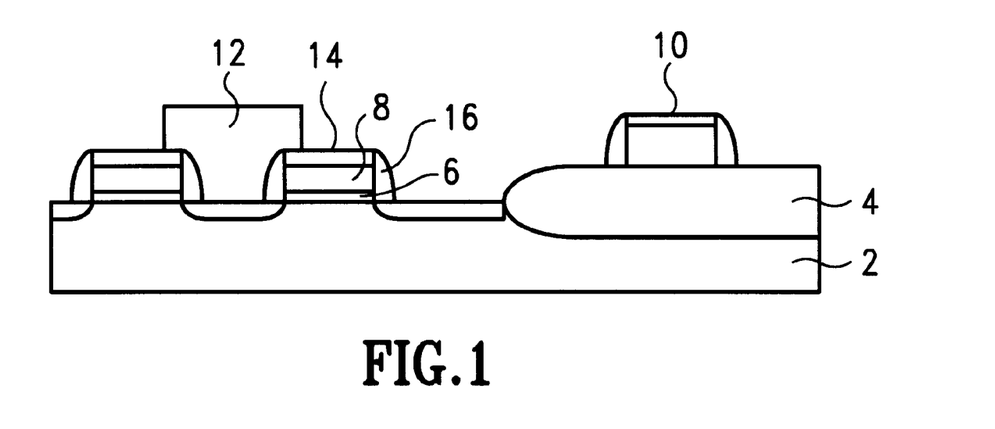
FIG. 1 is a cross sectional view of a semiconductor wafer illustrating the step of forming a transistor, word line and bit line on a semiconductor substrate.

Referring to FIG. 1, a single crystal P-type substrate 2 with a <100> crystallographic orientation is used for the preferred embodiment. A thick field oxide region 4, FOX 4, is created for the purposes of isolation. Generally speaking, the FOX 4 region is created via photolithography and dry etching steps to etch a silicon nitridesilicon dioxide composite layer. After the photoresist is removed and wet cleaned, a thermal oxidation in an oxygen-steam ambient is used to form the FOX 4 region, to a thickness of about 3000–8000 angstroms.

Initially, a silicon dioxide layer 6 is created atop the substrate 2 to use as a gate oxide. In the preferred embodiment, the silicon dioxide layer 6 is formed by using an oxygen-steam ambient, at a temperature between about 750 to 1100° C. Alternatively, the gate oxide 6 may be formed using other known oxide chemical compositions and procedures. As is known in the art, the silicon dioxide layer 4 can be formed by using chemical vapor deposition (CVD) process, using TEOS as a source at a temperature between about 600 to 800° C., at a pressure 0.1 to 10 torrs. In the preferred embodiment, the thickness of the silicon dioxide layer 6 is approximately 30–200 angstroms.

Still referring to FIG. 1, after the first silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness about 1000–5000 angstroms. Then, a word line 10, a bit line 12, gate structures with cap layer 14, and side wall spacers 16, are formed by well known technology and is not particularly germane to the present invention. Thus, only a cursory description of the formation of gate structure is given here.

Figure 2:
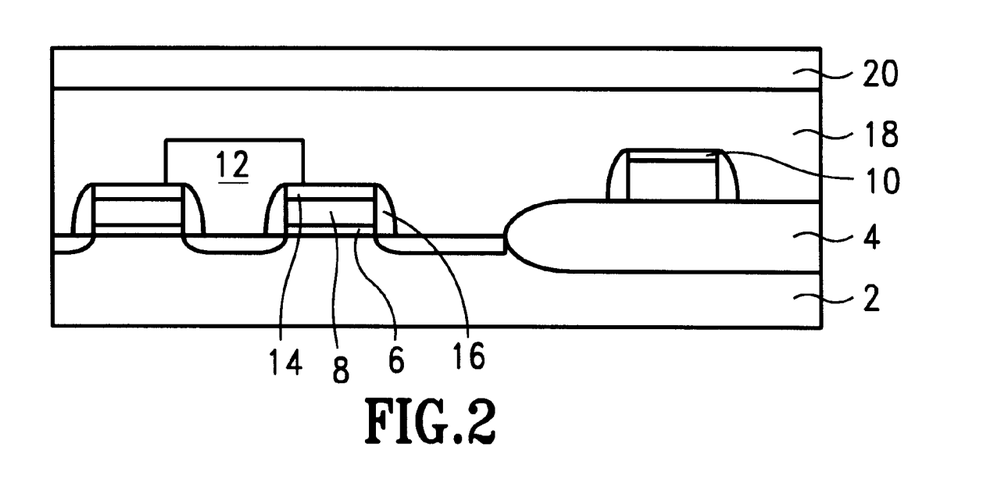
FIG. 2 is a cross sectional view of a semiconductor wafer illustrating the step of forming a dielectric layer and a nitride layer on the semiconductor substrate.
Figure 3:
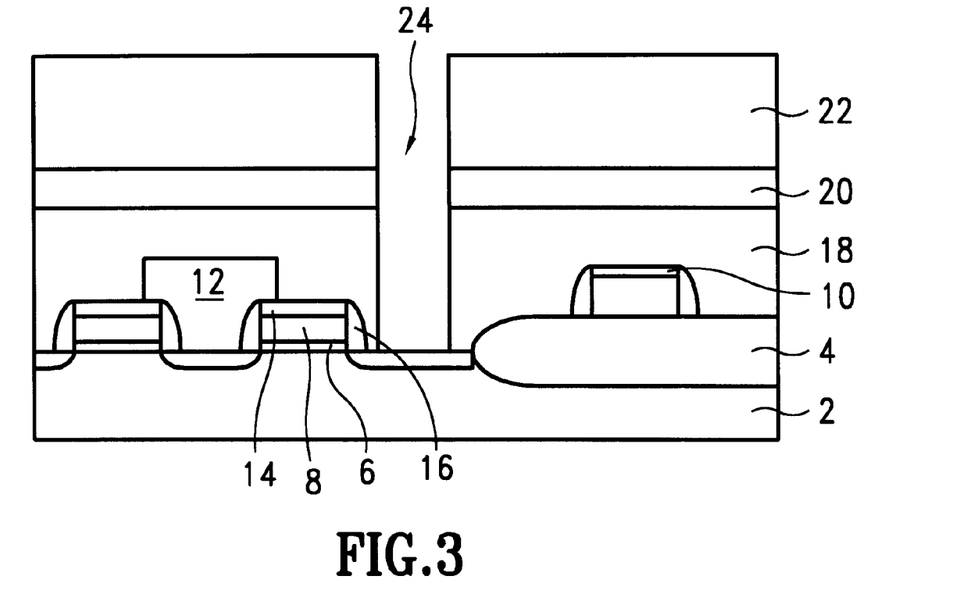
FIG. 3 is a cross sectional view of a semiconductor wafer illustrating the step of forming a contact hole in the nitride layer and in the dielectric layer.

As shown in FIG. 2, a dielectric layer 18 for isolation is formed on the gate structures, FOX 4 and substrate 2 to a thickness about 3000–10000 angstroms. The dielectric layer 18 is preferably formed of silicon oxide. A nitride layer 20 is subsequently formed on the dielectric layer 18. The nitride layer 20 is used as an etching barrier to prevent the dielectric layer 18 from etching for later process. The nitride layer 20 has a thickness at a range about 300–2000 angstroms. Then, referring to FIG. 3, a first photoresist 22 is pattern on the nitride layer 20 to expose a region where will be generated a contact hole for subsequent process. An etching is used to etch the dielectric layer 18 and the nitride layer 20 to form a contact hole 24. In one embodiment, a plasma etching is performed to create the contact hole 24 for storage node contact. The etchant to remove oxide is selected from the group of $CCl_2F_2$, $CHF_3/CF_4$, $CHF_3/O_2$, $CH_3CHF_2$, $CF_4/O_2$, while the nitride layer is removed by using $CF_4/H_2$, $CHF_3$ or $CH_3CHF_2$. Then the first photoresist is removed away.

Figure 4:
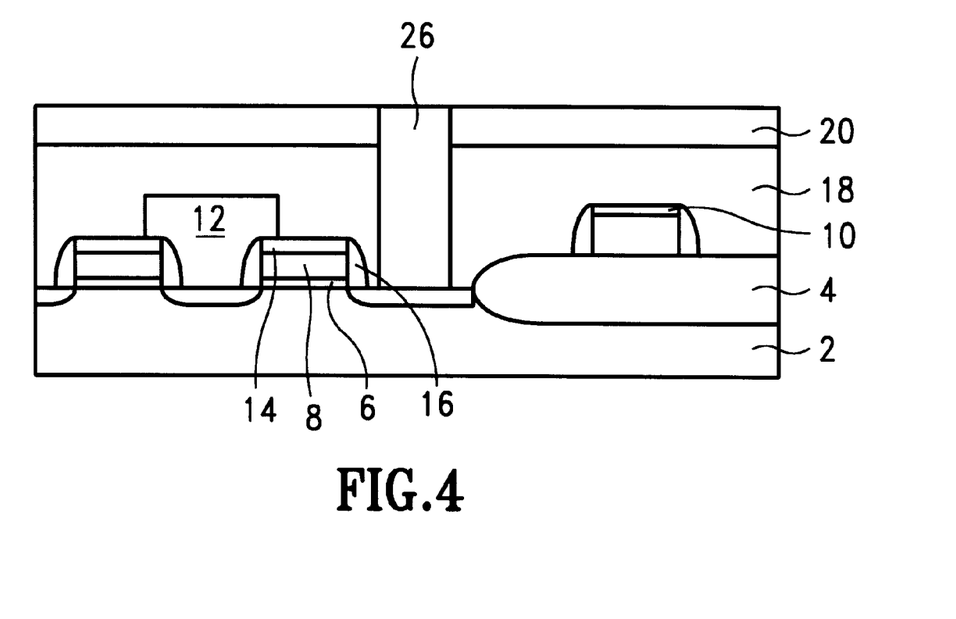
FIG. 4 is a cross sectional view of a semiconductor wafer illustrating the step of forming a polysilicon plug in the contact hole.

Turning next to FIG. 4, a first conductive (not shown) layer is subsequently deposited on the nitride layer 20 and refilled the contact hole 24. Preferably, the first conductive layer can be formed using doped polysilicon, in-situ doped polysilicon or metal such as aluminum, copper, tungsten, titanium, silicide, PtSi, WSi, $TiSi_2$ or $CoSi_2$. An etching is then used to etch the first conductive layer back until the nitride layer 20 is reached to form a plug 26 in the contact hole 24. The etchant to etch polysilicon is $SiCl_4/Cl_2$, $BCl_3/Cl_2$, $HBr/Cl_2/O_2$, $HBr/O_2$, $Br_2/SF_6$ or $SF_6$.

Figure 5:
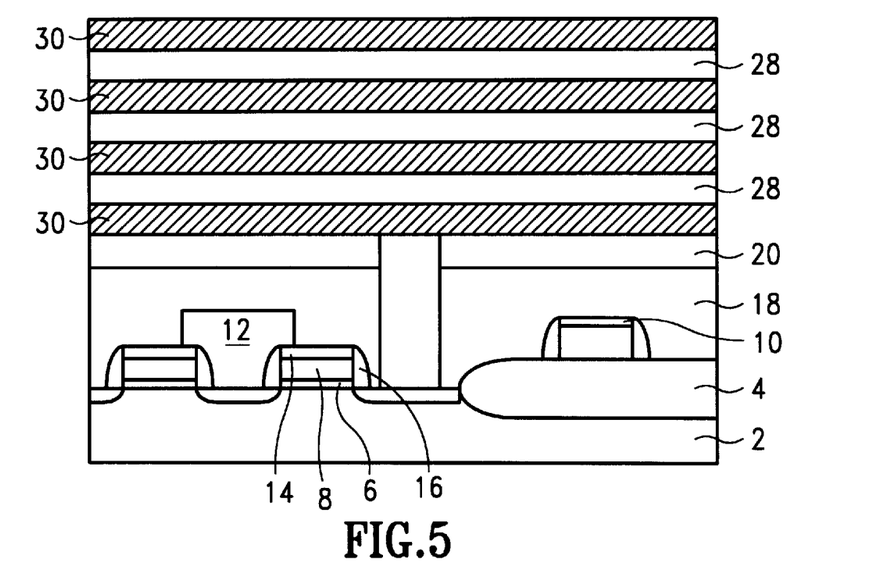
FIG. 5 is a cross sectional view of a semiconductor wafer illustrating the step of forming a composition layer consisting of alternating BPSG (borophosphosilicate glass) layers and silicon oxide layers on the nitride layer and the polysilicon plug.

Turning next to FIG. 5, a composition layer consisting of alternating BPSG layers 28 and silicon dioxide layers 30 is formed on the nitride layer 20 and the top of the plug 26. The composition layer is formed on the nitride layer 20 and the plug 26 repeatedly by deposition. The composition layers are composed of odd layers and even layers. The odd layers may be silicon dioxide layers and the even layers may be BPSG, or alternatively, the odd layers may be BPSG and the even layers may be silicon dioxide layers. The BPSG layers 28 can be formed by low pressure chemical vapor deposition using tetraethylorthosilicate (TEOS) as a reactant. Boron and phosphorus are added during the formation of the borophosphosilicate glass layer. The thickness of the BPSG layers 28 is 300 to 1000 angstroms. The silicon dioxide layers 30 can be formed by any suitable process such as chemical vapor deposition process, using TEOS as a source at a temperature between about 600 to 800° C., at a pressure of 1 to 10 torrs, and to a thickness about 300 to 1000 angstroms.

Figure 6:
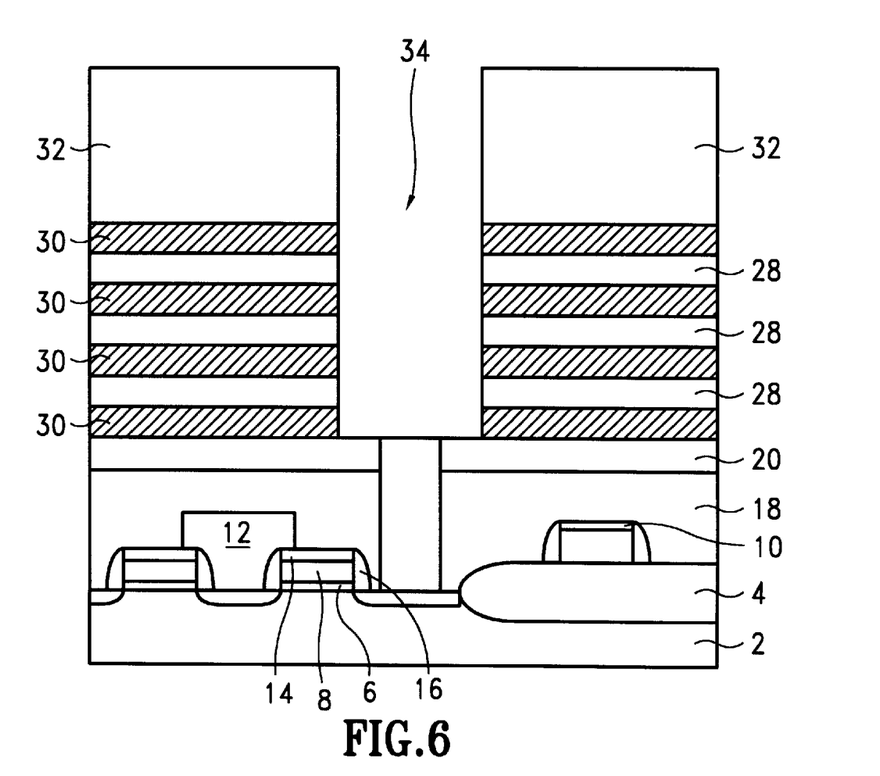
FIG. 6 is a cross sectional view of a semiconductor wafer illustrating the step of forming a opening in the composition layer to form the storage node later.

Turning next to FIG. 6, a second photoresist 32 is patterned on the composition layer to expose a region where will be generated a storage node for subsequent process. Then an etching is used to etch the composition layer for forming an opening 34 in composition layer. In this embodiment, a plasma etching is performed to create the opening 34 for forming the storage node. The etchant to removed oxide is selected from the group of $CCl_2F_2$, $CHF_3/CF_4$, $CHF_3/O_2$, $CH_3CHF_2$, $CF_4/O_2$. The second photoresist 32 is then stripped.

Figure 7:
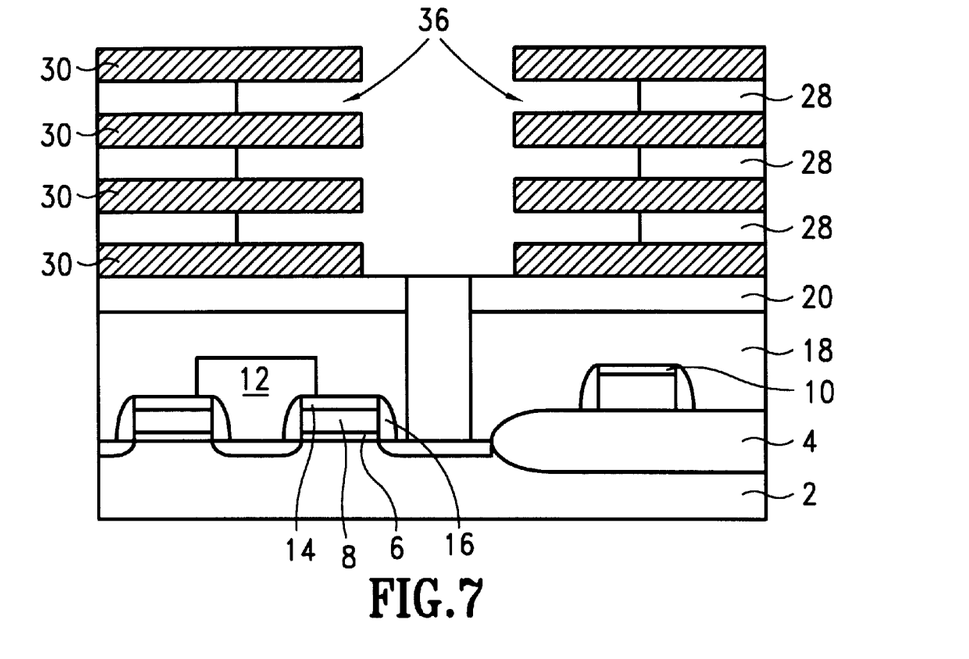
FIG. 7 is a cross sectional view of a semiconductor wafer illustrating the step of selectively etching the BPSG layers of the composition layer.

Next, referring to FIG. 7, a highly selective etching process is then used to removed a portion of the BPSG layers 28 to form lateral cavities 36. An important key of the present invention is that the etching rate of BPSG to etching is much greater than that of silicon dioxide. In preferred embodiment, the selective etching step utilizes a low pressure HF vapor to selectively etch the BPSG layers 28 and silicon dioxide layers 30. The relative susceptibility to etching of the BPSG layers 28 to the silicon dioxide layers 30 is about 2000 to 1. In addition, the susceptibility of BPSG to etching is also much greater than that of BSG, thus the BSG layer can be used to replace the silicon dioxide layer. Therefore, the BPSG layers 28 is etched away much more significantly than the silicon dioxide layers 30.

Figure 8:
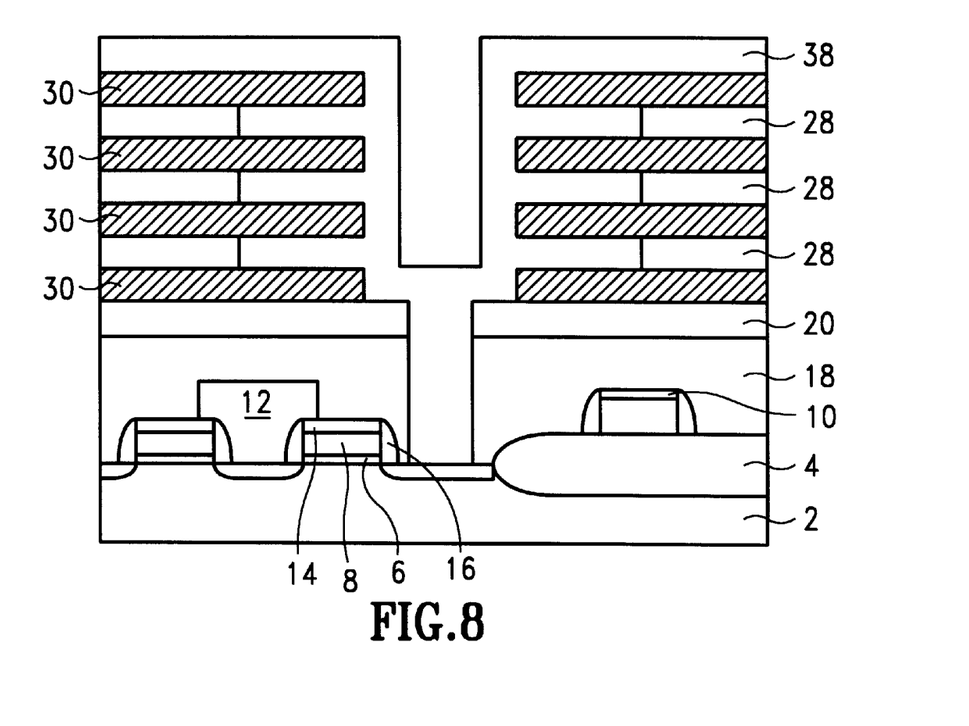
FIG. 8 is a cross sectional view of a semiconductor wafer illustrating the step of forming a second conductive layer on the composition layer.

Referring to FIG. 8, a second conductive layer 38 is deposited using a LPCVD (low pressure chemical vapor deposition) process along the surface of the composition layer, on the nitride layer 20 and the plug 26 exposed by the composition layer. In addition, the second conductive layer 38 is also conformally refilled in cavities 36 between the BPSG layers 28 and the silicon dioxide layers 30. In this embodiment, the second conductive layer 38 has a thickness between 300 to 3000 angstroms. The second conductive layer 38 can be chosen from doped polysilicon, in-situ doped polysilicon, aluminum, copper, tungsten, or titanium.

Figure 9:
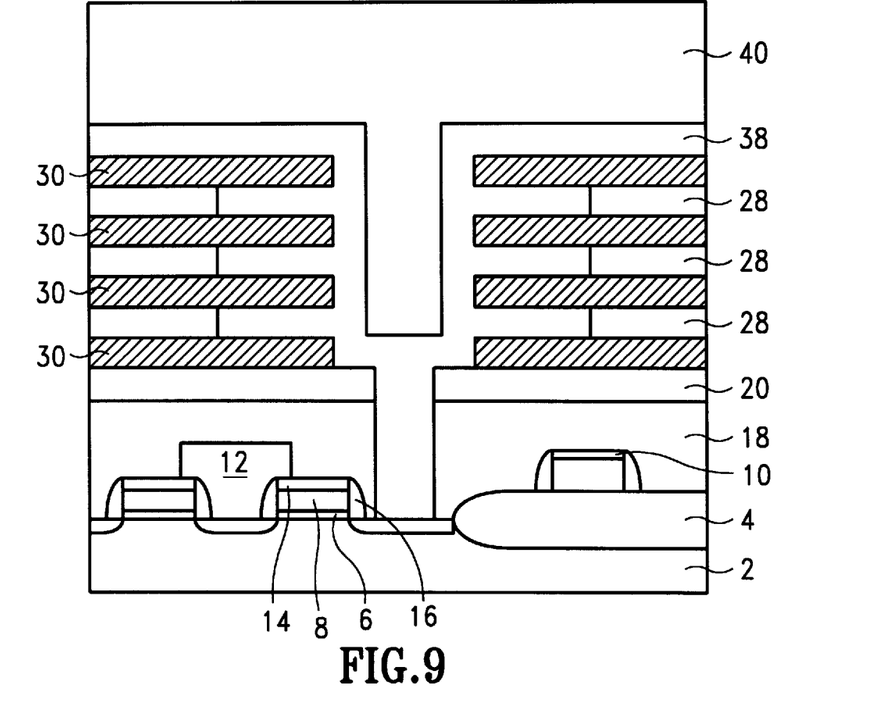
FIG. 9 is a cross sectional view of a semiconductor wafer illustrating the step of forming a thick SOG layer along the surface of the second conductive layer.
Figure 10:
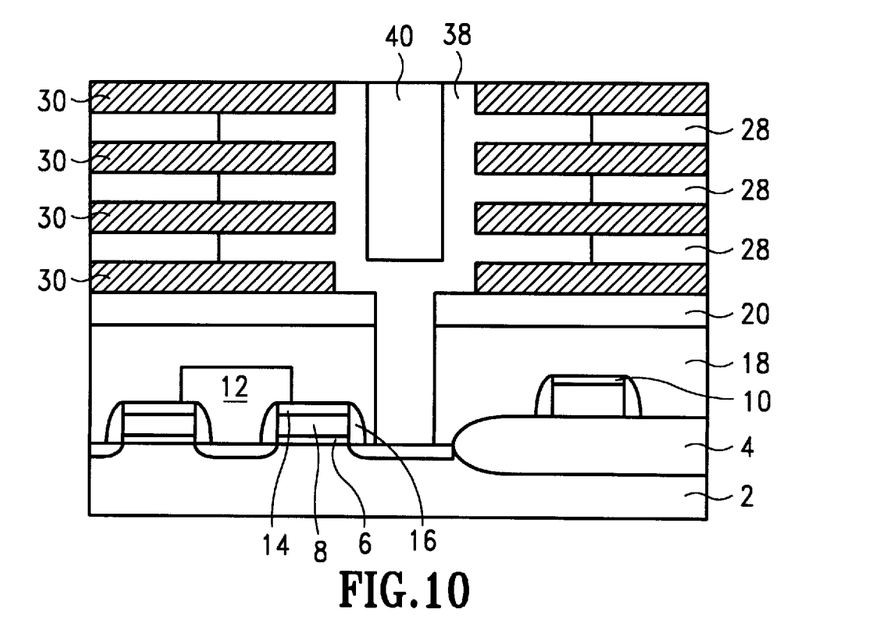
FIG. 10 is a cross sectional view of a semiconductor wafer illustrating the step of removing the SOG layer and the second conductive layer on the top surface of the composition layer.

Next, referring to FIG. 9, a thick SOG(spin-on glass) layer 40 is coated along the surface of the second conductive layer 38 to serve as a sacrificial layer. Alternatively, the SOG layer 40 can be replaced by a photoresist. Then, A portion of the SOG layer 40 and a portion of the second conductive layer 38 on the top surface of the composition layer are removed by using a CMP (chemical mechanism polishing) process, as shown in FIG. 10.

Figure 11:
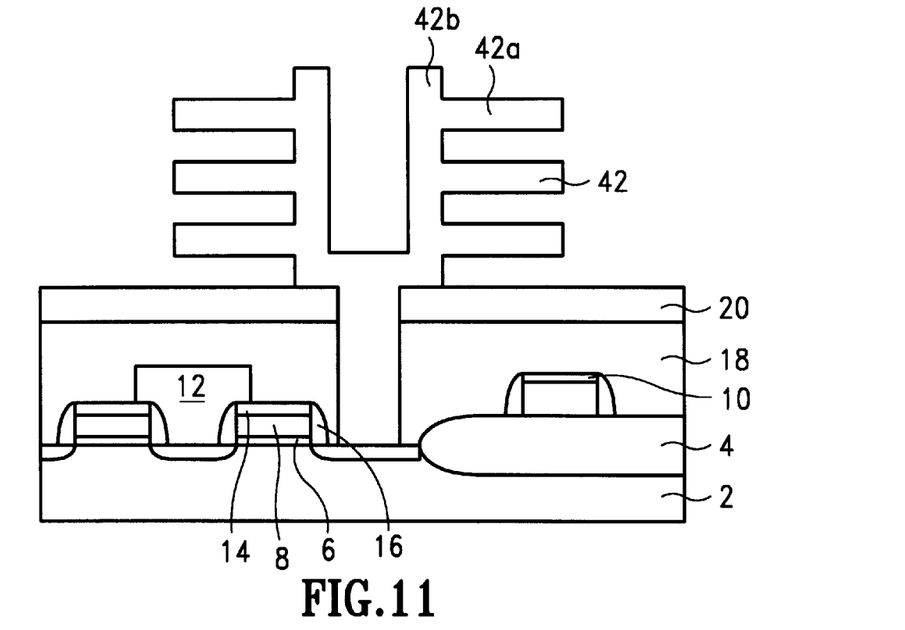
FIG. 11 is a cross sectional view of a semiconductor wafer illustrating the step of removing the BPSG and silicon oxide composition layers and the SOG layer.

Turning next to FIG. 11, the BPSG layers 28, the silicon dioxide layers 30 and the SOG layer 40 residual on the second conductive layer 38 are removed by using a BOE (buffer oxide etching) solution to form a multiple fin-shape 42 with a plurality of horizontal fins 42a and a crown shape comprising two vertical pillars 42b. The resulting structure is used as the bottom storage electrode of the capacitor to increase the area of the capacitor effectively.

Figure 12:
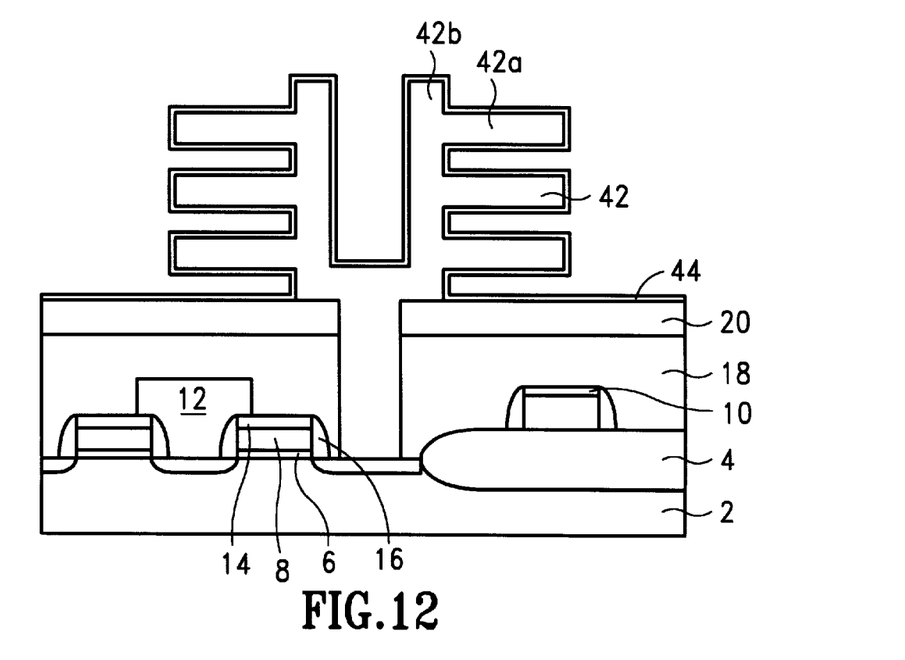
FIG. 12 is a cross sectional view of a semiconductor wafer illustrating the step of forming a thin dielectric layer along the surface of the second conductive layer and the nitride layer.

Turning to FIG. 12, the next step is the deposition of a thin dielectric film 44 along the surface of the second conductive layers 38 and the nitride layer 20. Typically, the dielectric film 44 is preferably formed of either a double film of nitride/oxide film, a triple film of oxide/nitride/oxide, or any other high dielectric film such as tantalum oxide($Ta_2O_5$), BST, PZT, PLZT, etc. Finally, referring to FIG. 13, a third conductive layer 46 is deposited over the dielectric film 44. The third conductive layer 46 is used as the cell plate and is formed of doped polysilicon, in-situ doped polysilicon, aluminum, copper, tungsten or titanium.

The present invention can provide various benefits over the prior art. First, the multiple fin-shaped capacitor structure is fabricated in only one-step conductive layer deposition and this can effectively avoid the fin crack. Second, a multiple fin-shape structure can significantly increase the surface area of the capacitor. Therefore the present invention increases the performance of the capacitor.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A capacitor of a dynamic random access memory cell, said capacitor comprises:

a bottom storage electrode formed on a semiconductor substrate, said bottom storage electrode being of a plurality of horizontal fins and a crown shape, wherein said crown shape comprises two vertical pillars, and said plurality of horizontal fins extending outside from an external surface of said crown shape, wherein upper ends of said two vertical pillars extending upwards are higher than each one of said plurality of horizontal fins;

a dielectric layer covering the surface of said bottom storage electrode; and a top storage electrode formed atop said dielectric layer.

2. The capacitor of claim 1, further comprising a stack of a dielectric layer and a nitride layer located between said bottom storage electrode and said semiconductor substrate.

3. The capacitor of claim 2, wherein said bottom storage electrode communicates to said semiconductor substrate via a hole in said stack of the dielectric layer and the nitride layer.

4. The capacitor of claim 3, wherein said dielectric layer comprise of silicon dioxide layer.

5. The capacitor of claim 1, wherein said dielectric layer is selected from a group of N/O, O/N/O, $Ta_2O_5$, BST, PZT and PLZT.

6. The capacitor of claim 1, wherein said bottom storage electrode are selected from the group of doped polysilicon, in-situ doped polysilicon, aluminum, copper, tungsten, and titanium combinations thereon.

7. The capacitor of claim 1, wherein said top storage electrode are selected from the group of doped polysilicon, in-situ doped polysilicon, aluminum, copper, tungsten, and titanium combinations thereon.

8. The capacitor of claim 1, wherein said plurality of horizontal fins and said two vertical pillars have thickness of a range between 300–1000 angstroms.

9. A capacitor of a dynamic random access memory cell, said capacitor comprising:

a first dielectric layer formed on a semiconductor substrate;

a nitride layer formed on said first dielectric layer, wherein said nitride layer has a contact hole thereon for exposing a portion of surfaces of said semiconductor substrate;

a plug formed into said contact hole for electrical connection with said a bottom storage electrode formed on said nitride layer and said plug, said bottom storage electrode communicating to said semiconductor substrate via said plug, said bottom storage electrode being of a plurality of horizontal fins and a crown shape, wherein said crown shape comprising two vertical pillars, and said plurality of horizontal fins extending outside from an external surface of said crown shape, wherein upper ends of said two vertical pillars are extending upwards from and higher than upper surfaces of top ones of said plurality of horizontal fins;

a second dielectric layer covering the surface of said bottom storage electrode; and a top storage electrode formed atop said second dielectric layer.

10. The capacitor of claim 9, wherein said first dielectric layer comprise of silicon dioxide layer.

11. The capacitor of claim 9, wherein said second dielectric layer is selected from a group of N/O, O/N/O, $Ta_2O_5$, BST, PZT and PLZT.

12. The capacitor of claim 9, wherein said bottom storage electrode are selected from the group of doped polysilicon, in-situ doped polysilicon, aluminum, copper, tungsten, and titanium combinations thereon.

13. The capacitor of claim 9, wherein said top storage electrode are selected from the group of doped polysilicon, in-situ doped polysilicon, aluminum, copper, tungsten, and titanium combinations thereon.

14. The capacitor of claim 9, wherein said plurality of horizontal fins and said two vertical pillars have thickness of a range between 300–1000 angstroms.

* * * * *